(12) United States Patent
Hiranuma et al.

(10) Patent No.: US 8,070,296 B2
(45) Date of Patent: Dec. 6, 2011

(54) ILLUMINATION APPARATUS, DISPLAY APPARATUS AND PROJECTION DISPLAY APPARATUS

(75) Inventors: Yoshinao Hiranuma, Hirakata (JP); Masutaka Inoue, Hirakata (JP); Susumu Tanase, Kadoma (JP); Takaaki Abe, Osaka (JP); Seiji Tsuchiya, Ootsu (JP); Masahiro Haraguchi, Daito (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 819 days.

(21) Appl. No.: 12/117,794

(22) Filed: May 9, 2008

(65) Prior Publication Data
US 2008/0279238 A1     Nov. 13, 2008

(30) Foreign Application Priority Data
May 9, 2007   (JP) .................................. 2007-124451

(51) Int. Cl.
*H01S 3/04*   (2006.01)
(52) U.S. Cl. ........................................ 353/52; 362/276
(58) Field of Classification Search .................... 372/34; 353/52; 362/249.04, 276, 294, 802
See application file for complete search history.

(56) References Cited

U.S. PATENT DOCUMENTS

| 7,055,957 B2 * | 6/2006 | Troyer | 353/31 |
| 7,300,155 B2 * | 11/2007 | Miyazawa et al. | 353/30 |
| 2005/0200311 A1 * | 9/2005 | Youle | 315/291 |

FOREIGN PATENT DOCUMENTS
JP   2005-149943 A1   6/2005

* cited by examiner

*Primary Examiner* — Tony Ko
(74) *Attorney, Agent, or Firm* — Marvin A. Motsenbocker; Mots Law, PLLC (57) ABSTRACT

An illumination apparatus includes: a solid-state light source; a Peltier element configured to cool the solid-state light source; a light amount sensor configured to detect an amount of a light emitted from the solid-state light source; a power consumption monitor configured to monitor power consumptions of the solid-state light source and the Peltier element; and a power controller configured to control powers supplied to the solid-state light source and the Peltier element. The power controller controls the powers supplied to the solid-state light source and the Peltier element, on the basis of the light amount detected by the light amount sensor and a sum of the power consumptions of the solid-state light source and the Peltier element.

8 Claims, 6 Drawing Sheets

ILLUMINATION APPARATUS, DISPLAY APPARATUS AND PROJECTION DISPLAY APPARATUS

CROSS REFERENCE TO RELATED APPLICATIONS

This application is based upon and claims the benefit of priority from prior Japanese Patent Application No. 2007-124451, filed on May 9, 2007; the entire contents of which are incorporated herein by reference.

BACKGROUND OF THE INVENTION

1. Field of the Invention

The present invention relates to an illumination apparatus, a display apparatus and a projection display apparatus, each including a solid-state light source and a light valve which modulates a light emitted from the solid-state light source.

2. Description of the Related Art

There has heretofore been known a display apparatus including: a solid-state light source such as an LED (Light Emitting Diode) and an LD (Laser Diode); and a light valve which modulates a light emitted from the solid-state light source. Here, the solid-state light source generates heat when power is supplied thereto. As an operating temperature of the solid-state light source is increased, an amount of a light emitted from the solid-state light source is reduced.

Therefore, there has been proposed a display apparatus including a cooling device, such as a Peltier element, which cools a solid-state light source in order to suppress reduction in a light amount due to an increase in an operating temperature of the solid-state light source (see, for example, claims 6 and 7, Paragraph [0024] and the like in Japanese Patent Application Publication No. 2005-149943).

To be more specific, in the display apparatus described above, cooling power of the cooling device is controlled so as to allow the amount of a light emitted from the solid-state light source to approach a target light amount. Therefore, the amount of the light emitted from the solid-state light source is maintained constant.

Recently, from the viewpoint of environmental consideration and the like, reduction in power consumption of the display apparatus has been demanded.

However, in the display apparatus described above, the cooling power of the cooling device is merely controlled to keep constant the amount of the light emitted from the solid-state light source. Therefore, measures to meet the demand for reduction in power consumption are insufficient.

SUMMARY OF THE INVENTION

As one aspect of the present invention, an illumination apparatus includes: a solid-state light source (solid-state light source 10); a cooling device (Peltier element 20) which cools the solid-state light source; a light amount sensor (light amount sensor 70) which detects an amount of a light emitted from the solid-state light source; a monitor (power consumption monitor 153) configured to monitor a power consumption of the solid-state light source and a power consumption of the cooling device; and a controller (power controller 154) configured to control a power supplied to the solid-state light source and a power supplied to the cooling device. In the illumination apparatus, the controller controls the power supplied to the solid-state light source or the power supplied to the cooling device, based on the light amount detected by the light amount sensor and a sum of the power consumptions of the solid-state light source and the cooling device.

According to the aspect described above, the sum of the power consumptions of the solid-state light source and the cooling device is taken into consideration for control of the power supplied to the solid-state light source or the cooling device. Thus, the power consumption can be reduced while keeping constant the amount of the light emitted from the solid-state light source.

In the aspect of the present invention described above, the controller controls the power supplied to the solid-state light source or the power supplied to the cooling device so as to reduce as much as possible the sum of the power consumptions of the solid-state light source and the cooling device. Note that the controller may minimize the sum of the power consumptions of the solid-state light source and the cooling device.

In the aspect of the present invention described above, the controller controls the power supplied to the solid-state light source or the power supplied to the cooling device so as to maintain the light amount detected by the light amount sensor, at a target light amount.

In the aspect of the present invention described above, the controller repeatedly increases or reduces the power supplied to the cooling device in a cycle of a predetermined period even if the power supplied to the solid-state light source and the power supplied to the cooling device are in a steady state.

In the aspect of the present invention described above, the controller repeatedly increases or reduces the power supplied to the solid-state light source in a cycle of a predetermined period even if the power supplied to the solid-state light source and the power supplied to the cooling device are in a steady state.

In the aspect of the present invention described above, the solid-state light source is an array light source having a plurality of light source elements arranged in array.

As one aspect of the present invention, a display apparatus includes: a light valve which modulates a light emitted from the solid-state light source; and the illumination apparatus described above.

As one aspect of the present invention, a projection display apparatus includes: a light valve which modulates a light emitted from the solid-state light source; a projection lens unit which projects the light modulated by the light valve; and the illumination apparatus described above.

DETAILED DESCRIPTION OF THE EMBODIMENTS

With reference to the drawings, a display apparatus according to an embodiment of the present invention will be described below. Note that, in the following description of the drawings, the same or similar parts will be denoted by the same or similar reference numerals.

However, it should be noted that the drawings are conceptual and ratios of respective dimensions and the like are different from actual ones. Therefore, specific dimensions and the like should be determined by taking into consideration the following description. Moreover, as a matter of course, also among the drawings, there are included portions in which dimensional relationships and ratios are different from each other.

First Embodiment

Schematic Description of Display Apparatus

Figure 1:
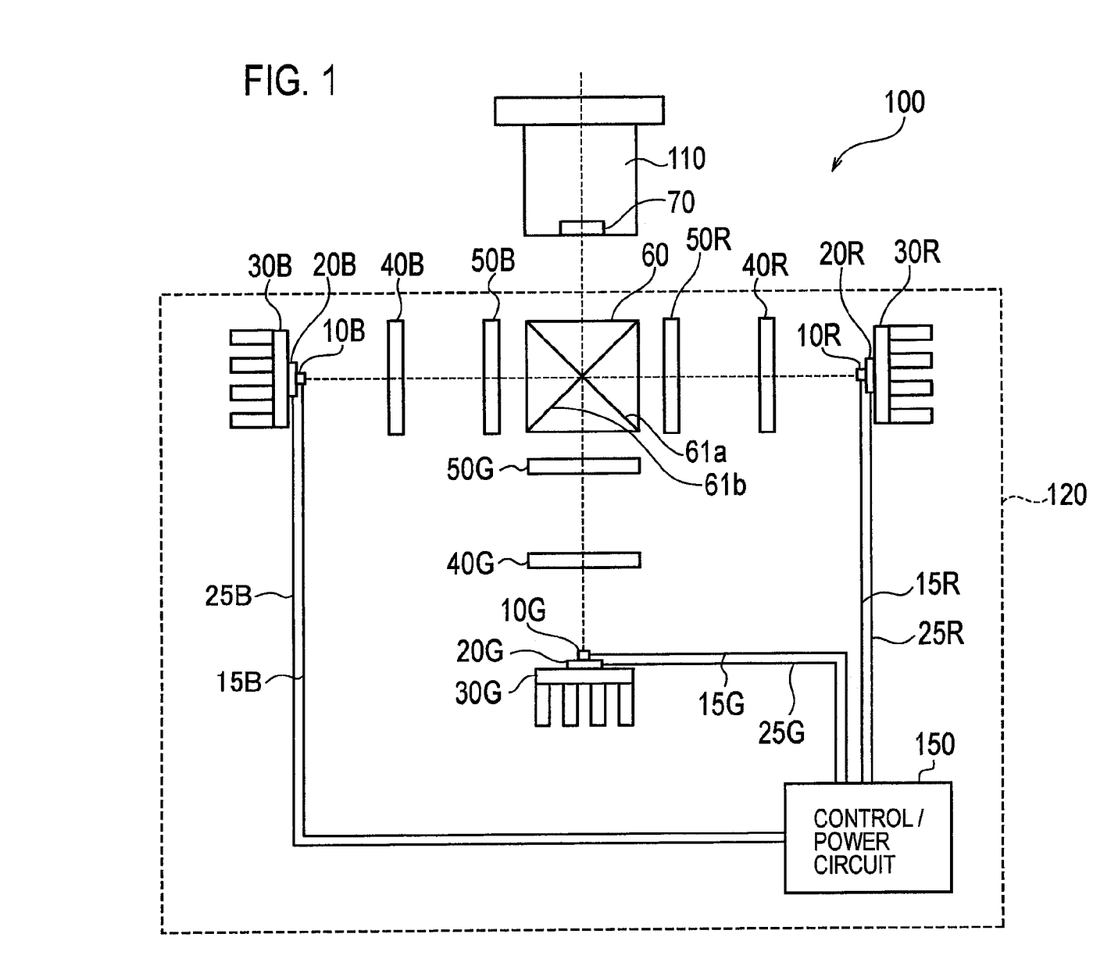
FIG. 1 is a view showing a configuration of a projection display apparatus 100 according to a first embodiment.

With reference to the drawings, a display apparatus according to a first embodiment will be schematically described below. FIG. 1 is a view showing a configuration of a projection display apparatus 100 according to the first embodiment.

As shown in FIG. 1, the projection display apparatus 100 has a projection lens unit 110 and an illumination apparatus 120.

The projection lens unit 110 projects an image light emitted from the illumination apparatus 120 onto a screen (not shown).

The illumination apparatus 120 includes: a plurality of solid-state light sources 10 (a solid-state light source 10R, a solid-state light source 10G and a solid-state light source 10B); a plurality of Peltier elements 20 (a Peltier element 20R, a Peltier element 20G and a Peltier element 20B); a plurality of heat sinks 30 (a heat sink 30R, a heat sink 30G and a heat sink 30B); a plurality of diffraction elements 40 (a diffraction element 40R, a diffraction element 40G and a diffraction element 40B); a plurality of liquid crystal panels 50 (a liquid crystal panel 50R, a liquid crystal panel 50G and a liquid crystal panel 50B); a cross dichroic cube 60; and a light amount sensor 70.

The solid-state light source 10R is a solid-state light source, such as an LED and an LD, which emits a red component light. Similarly, the solid-state light sources 10G and 10B are solid-state light sources, such as LEDs and LDs, which emit a green component light and a blue component light, respectively. Note that the solid-state light sources 10 may be an array light source having a plurality of LEDs or LDs arranged in array.

Here, a control/power circuit 150 described later is connected to the solid-state light sources 10R, 10G and 10B through respective power lines 15 (a power line 15R, a power line 15G and a power line 15B). To each of the solid-state light sources 10, power is supplied from the control/power circuit 150 through each of the power lines 15. An amount of a light emitted from each of the solid-state light sources 10 is controlled by the control/power circuit 150.

The Peltier element 20R is an element which absorbs heat emitted from the solid-state light source 10R in response to the power supply, and transmits the heat emitted from the solid-state light source 10R to the heat sink 30R.

Similarly, the Peltier element 20G is an element which absorbs heat emitted from the solid-state light source 10G in response to the power supply, and transmits the heat emitted from the solid-state light source 10G to the heat sink 30G. Moreover, the Peltier element 20B is an element which absorbs heat emitted from the solid-state light source 10B in response to the power supply, and transmits the heat emitted from the solid-state light source 10B to the heat sink 30B.

Here, the control/power circuit 150 described later is connected to the Peltier elements 20R, 20G and 20B through respective power lines 25 (a power line 25R, a power line 25G and a power line 25B). To each of the Peltier elements 20, power is supplied from the control/power circuit 150 through each of the power lines 25. Moreover, cooling power of each of the Peltier elements 20 is controlled by the control/power circuit 150.

The heat sink 30R is formed of a thermally conductive member such as metal, and radiates the heat transmitted from the Peltier element 20R. Similarly, the heat sinks 30G and 30B are formed of thermally conductive members such as metal, and radiate the heat transmitted from the Peltier elements 20G and 20B. Note that the heat sinks 30R, 30G and 30B are preferably cooled by a cooling fan (not shown) which is communicated with outside of the illumination apparatus 120.

The diffraction element 40R uniformizes the red component light emitted from the solid-state light source 10R, and the liquid crystal panel 50R is irradiated with the uniformized red component light. Similarly, the diffraction elements 40G and 40B uniformize the green component light and the blue component light, which are emitted from the solid-state light sources 10G and 10B, respectively, and the liquid crystal panels 50G and 50B are irradiated with the uniformized green component light and blue component light.

The liquid crystal panel 50R modulates the red component light emitted from the solid-state light source 10R according to an image input signal. Similarly, the liquid crystal panels 50G and 50B modulate the green component light and the blue component light, which are emitted from the solid-state light sources 10G and 10B, respectively, according to image input signals.

The cross dichroic cube 60 combines the red component light, the green component light and the blue component light, which are emitted from the liquid crystal panels 50R, 50G and 50B, respectively. Specifically, the cross dichroic cube 60 has: a mirror surface 61a which reflects the red component light toward the projection lens unit 110 and transmits the green component light and the blue component light therethrough toward the projection lens unit 110; and a mirror surface 61b which reflects the blue component light toward the projection lens unit 110 and transmits the green component light and the red component light therethrough toward the projection lens unit 110.

The light amount sensor 70 detects an amount of lights emitted from the solid-state light sources 10. Specifically, the light amount sensor 70 is provided outside an effective area of the lights emitted from the solid-state light sources 10. Note that, although not shown in FIG. 1, the light amount sensor 70 is connected to the control/power circuit 150 described later.

For example, the light amount sensor 70 is provided in the projection lens unit 110. Note that the light amount sensor 70 may be provided in the cross dichroic cube 60 or in an over scan portion of the screen (not shown).

The illumination apparatus 120 includes the control/power circuit 150 in addition to those described above.

The control/power circuit 150 is connected to the solid-state light sources 10R, 10G and 10B through the power lines 15R, 15G and 15B. The control/power circuit 150 supplies the power to the respective solid-state light sources 10 through the respective power lines 15. The control/power circuit 150 controls the power supplied to the respective solid-state light sources 10.

The control/power circuit 150 is connected to the Peltier elements 20R, 20G and 20B through the power lines 25R, 25G and 25B. The control/power circuit 150 supplies the power to the respective Peltier elements 20 through the respective power lines 25. The control/power circuit 150 controls the power supplied to the respective Peltier elements 20.

Note that the control/power circuit 150 will be described in detail later (see FIG. 3).

(Relationship Between Operating Temperature and Power Consumption)

Figure 2:
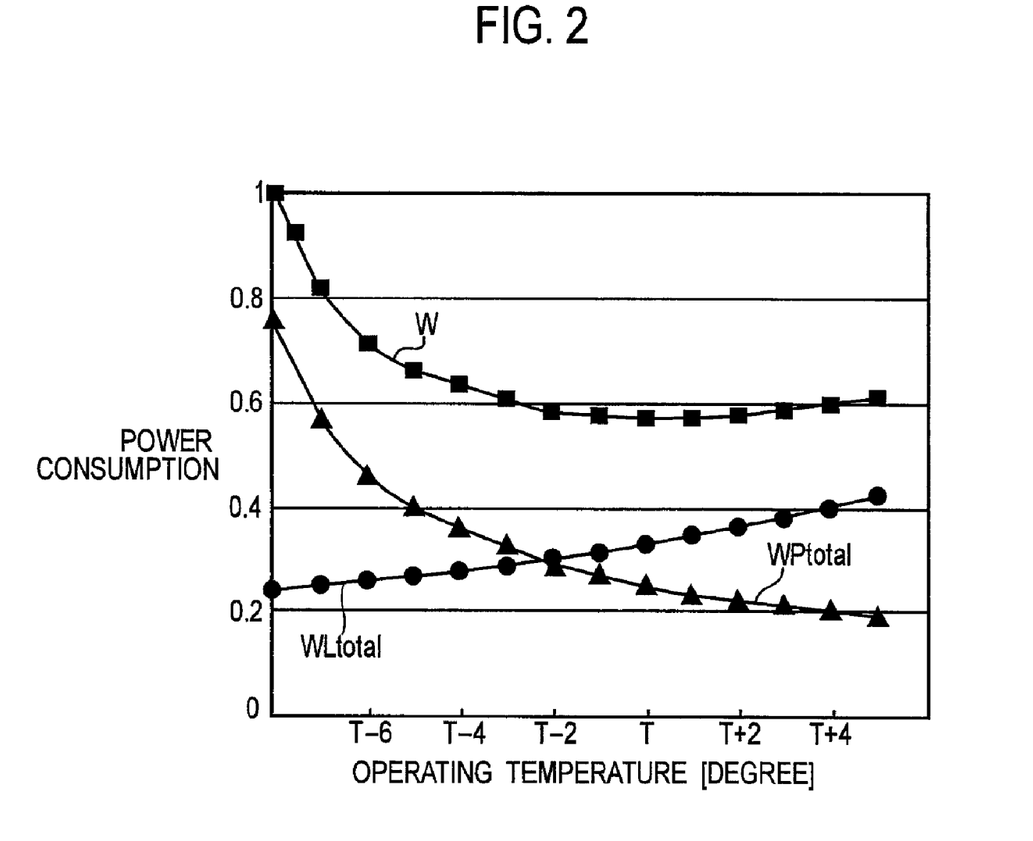
FIG. 2 is a graph showing a relationship between an operating temperature and a power consumption according to the first embodiment.

With reference to the drawings, description will be given below of a relationship between an operating temperature and a power consumption according to the first embodiment. FIG. 2 is a graph showing an example of the relationship between the operating temperature and the power consumption according to the first embodiment.

Specifically, FIG. 2 shows a relationship between the operating temperature and a sum ($WL_{total}$) of power consumptions of the solid-state light sources 10, a relationship between the operating temperature and a sum ($WP_{total}$) of power consumptions of the Peltier elements 20, and a relationship between the operating temperature and a total sum (W) of the power consumptions of the solid-state light sources 10 and the Peltier elements 20. Note that, in FIG. 2, a temperature T is a recommended operating temperature of the solid-state light sources 10. In other words, the total sum (W) of the power consumptions is at a minimum at the temperature T.

As shown in FIG. 2, the sum ($WL_{total}$) of the power consumptions of the solid-state light sources 10 is increased with an increase in the operating temperature. On the other hand, the sum ($WP_{total}$) of the power consumptions of the Peltier elements 20 is reduced with an increase in the operating temperature.

Meanwhile, the total sum (W) of the power consumptions fluctuates depending on characteristics of the Peltier elements 20 and environmental conditions. Specifically, it should be noted that the total sum (W) of the power consumptions is not always at a minimum even if the operating temperature is the recommended operating temperature T.

(Configuration of Control Circuit)

With reference to the drawings, description will be given below of a configuration of a control circuit according to the first embodiment. FIG. 3 is a block diagram showing a configuration of the control/power circuit 150 according to the first embodiment.

Figure 3:
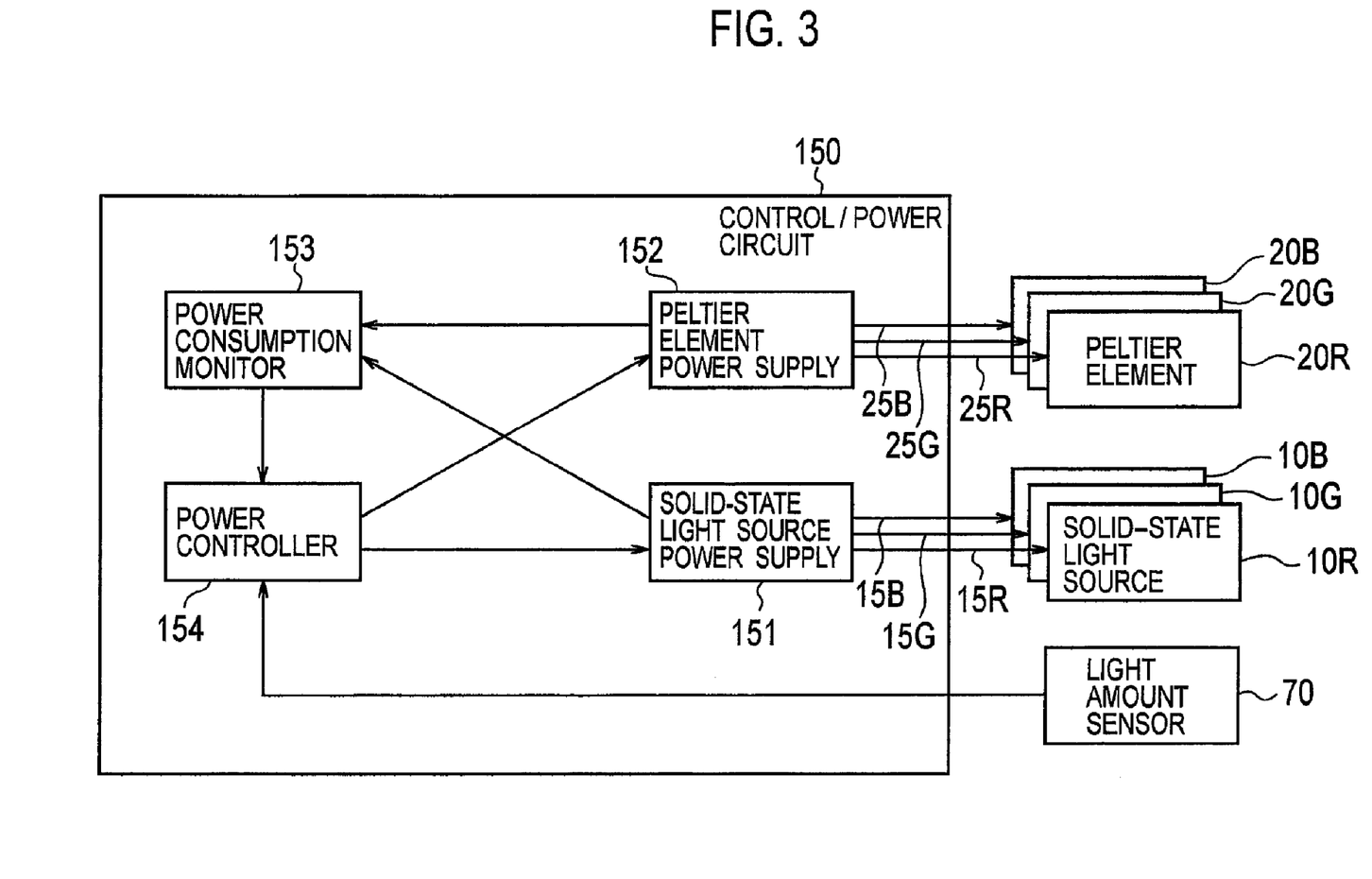
FIG. 3 is a block diagram showing a configuration of a control/power circuit 150 according to the first embodiment.

As shown in FIG. 3, the control/power circuit 150 includes a solid-state light source power supply 151, a Peltier element power supply 152, a power consumption monitor 153 and a power controller 154.

The solid-state light source power supply 151 supplies power to the respective solid-state light sources 10 through the respective power lines 15. The solid-state light source power supply 151 notifies the power consumption monitor 153 of the power consumptions of the respective solid-state light sources 10.

The Peltier element power supply 152 supplies power to the respective Peltier elements 20 through the respective power lines 25. The Peltier element power supply 152 notifies the power consumption monitor 153 of the power consumptions of the respective Peltier elements 20.

The power consumption monitor 153 monitors the power consumptions of the respective solid-state light sources 10 and the power consumptions of the respective Peltier elements 20. The power consumption monitor 153 notifies the power controller 154 of the total sum (W) of the power consumptions of the respective solid-state light sources 10 and the respective Peltier elements 20.

The power controller 154 controls the power ($\alpha$) supplied to the respective solid-state light sources 10 and the power ($\beta$) supplied to the respective Peltier elements 20. Specifically, the power controller 154 controls the power ($\alpha$) supplied to the respective solid-state light sources 10 by a predetermined step width ($\Delta\alpha$). Meanwhile, the power controller 154 controls the power ($\beta$) supplied to the respective Peltier elements 20 by a predetermined step width ($\Delta\beta$).

Here, the power controller 154 controls the power supplied to the respective solid-state light sources 10 and to the respective Peltier elements 20 so as to reduce as much as possible the total sum (W) of the power consumptions of the solid-state light sources 10 and the Peltier elements 20.

Note that the power controller 154 preferably minimizes the total sum (W) of the power consumptions of the solid-state light sources 10 and the Peltier elements 20.

Moreover, the power controller 154 controls the power supplied to the solid-state light sources 10 and to the Peltier elements 20 so as to maintain, at a target light amount, the light amount detected by the light amount sensor 70.

Here, the target light amount is an amount of lights that the solid-state light sources 10 should emit. Note that, since the lights emitted from the solid-state light sources 10 are modulated by the respective liquid crystal panels 50, the target light amount varies according to a modulation amount (that is, the image input signal) of each of the liquid crystal panels 50.

(Operations of Power Controller)

Figure 4:
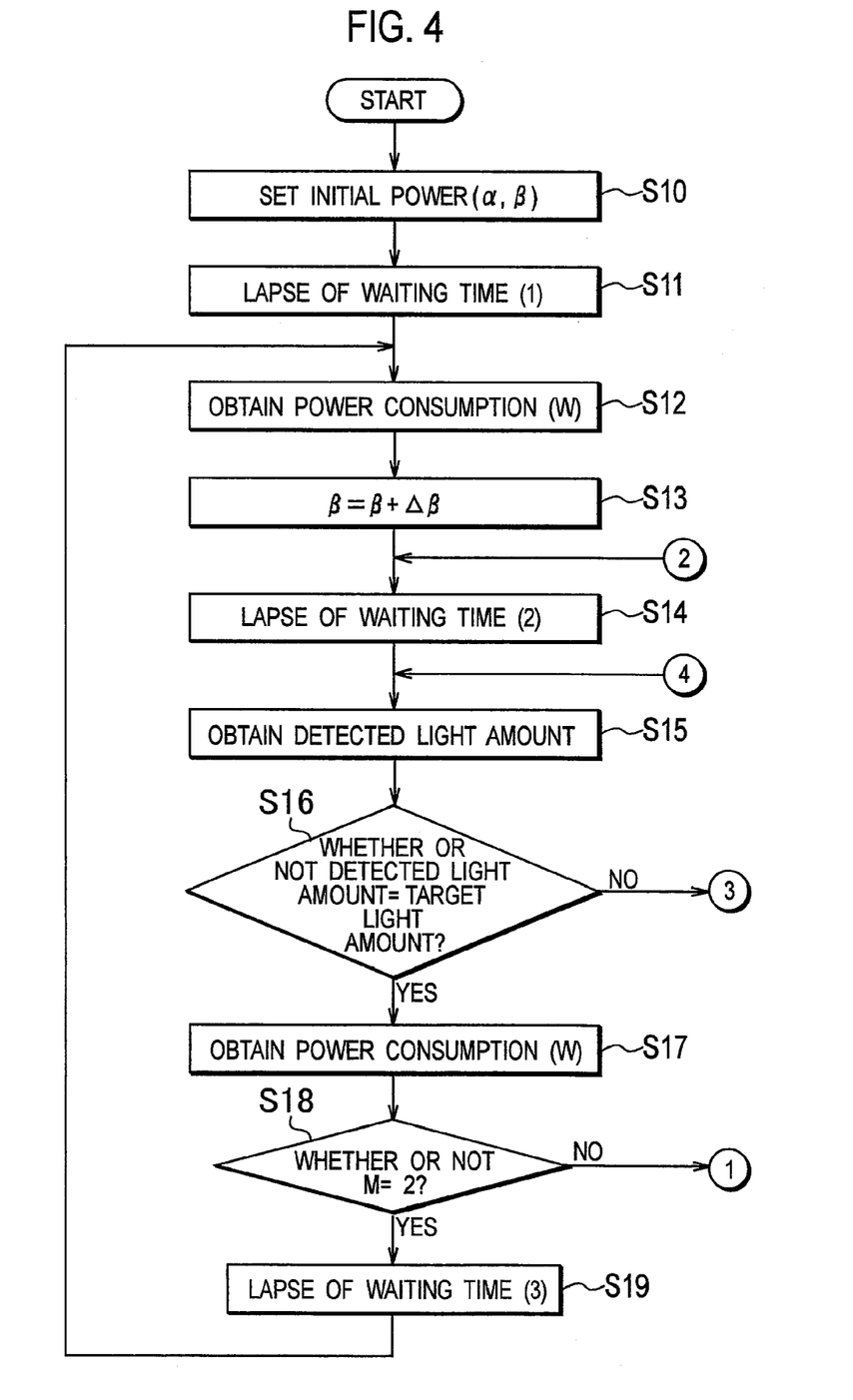
FIG. 4 is a flowchart showing operations of a power controller 154 according to the first embodiment.
Figure 5:
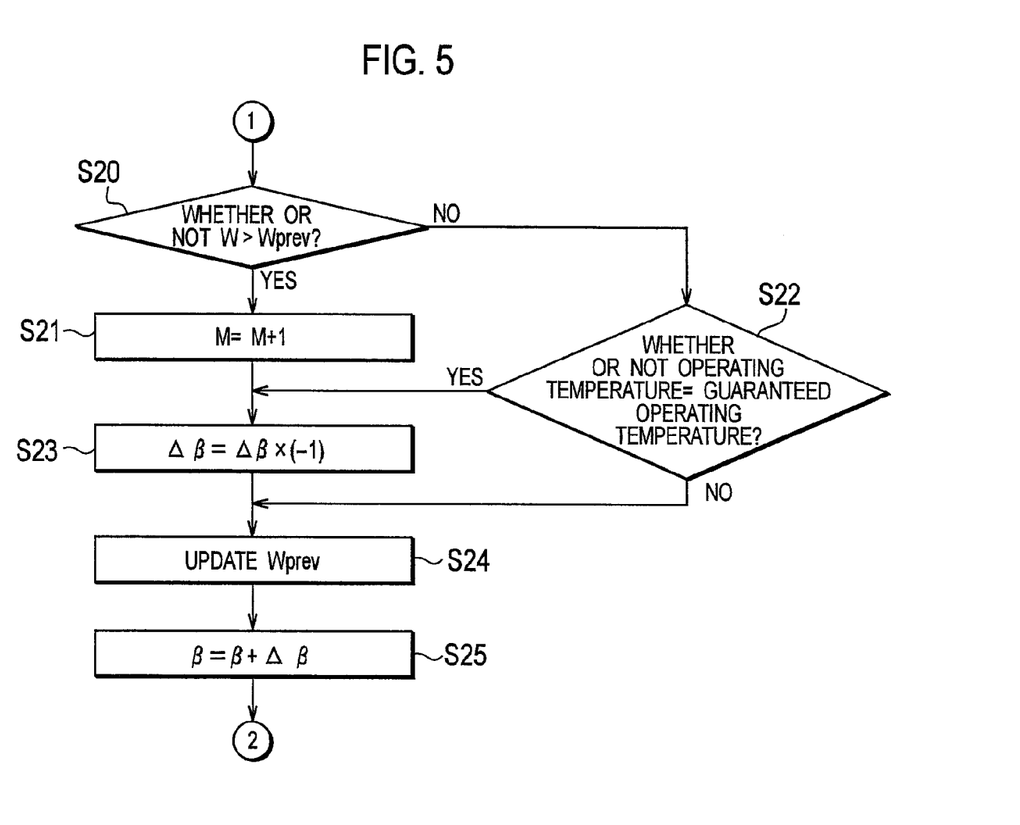
FIG. 5 is a flowchart showing operations of the power controller 154 according to the first embodiment.
Figure 6:
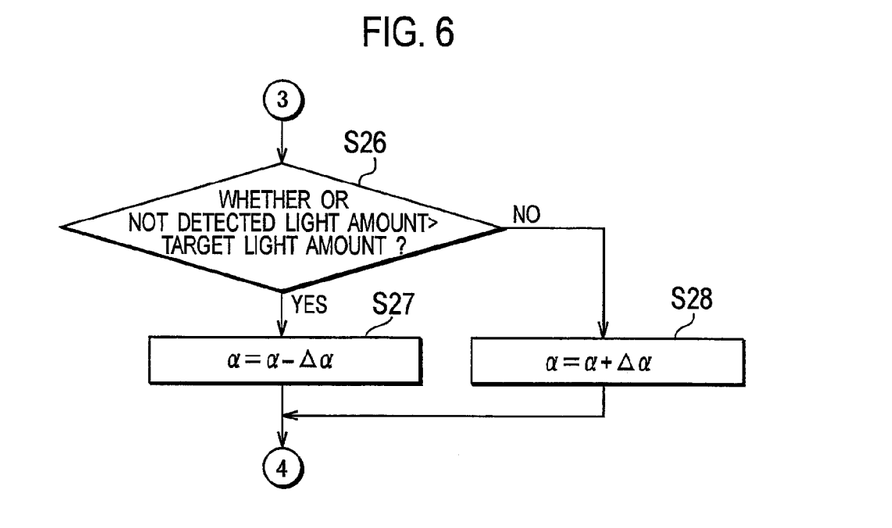
FIG. 6 is a flowchart showing operations of the power controller 154 according to the first embodiment.

With reference to the drawings, description will be given below of operations of the power controller according to the first embodiment. FIGS. 4 to 6 are flowcharts showing operations of the power controller 154 according to the first embodiment.

As shown in FIG. 4, in Step 10, the power controller 154 sets initial power as the power ($\alpha$) supplied to the solid-state light sources 10 and as the power ($\beta$) supplied to the Peltier elements 20. The initial power is, for example, the power of the solid-state light sources 10 and the Peltier elements 20, which corresponds to the recommended operating temperature (T), in FIG. 2 described above.

In Step 11, the power controller 154 is set in a waiting state until a waiting time (1) passes. The waiting time (1) is time required for operations of the solid-state light sources 10 and the Peltier elements 20 to become stable.

In Step 12, the power controller 154 obtains a total sum (power consumption (W)) of the power consumptions of the solid-state light sources 10 and the Peltier elements 20.

In Step 13, the power controller 154 increases the power ($\beta$) supplied to the Peltier elements 20 by a step width ($\Delta\beta$). Note that, in Step 13, the power controller 154 may reduce the power ($\beta$) supplied to the Peltier elements 20 by the step width ($\Delta\beta$).

In Step 14, the power controller 154 is set in a waiting state until a waiting time (2) passes. The waiting time (2) is time required for an operating temperature of the solid-state light sources 10 to become stable, the operating temperature being adjusted by the Peltier elements 20.

In Step 15, the power controller 154 obtains a light amount (detected light amount) which is detected by the light amount sensor 70.

In Step 16, the power controller 154 determines whether or not the detected light amount corresponds to the target light amount. If the detected light amount corresponds to the target light amount, the power controller 154 moves to a process in Step 17. On the other hand, if the detected light amount does not correspond to the target light amount, the power controller 154 moves to a process in Step 26 (see FIG. 6).

In Step 17, the power controller 154 obtains the total sum (power consumption (W)) of the power consumptions of the solid-state light sources 10 and the Peltier elements 20.

Note that, in the case where a series of processes are sequentially carried out from Step 12, the power controller 154 stores the power consumption (W) obtained in Step 12 as a power consumption ($W_{prev}$). Here, the power consumption (W) represents the current power consumption, and the power consumption ($W_{prev}$) represents the previous power consumption.

In Step 18, the power controller 154 determines whether or not the number of reversals (M) is "2".

Here, the number of reversals (M) is the number of times a polarity ("+"="increase" and "−"="decrease") of the step width ($\Delta\beta$) is reversed in the series of processes shown in FIGS. 4 to 6. An initial value of the number of reversals (M) is "0".

In Step 19, the power controller 154 is set in a waiting state until a waiting time (3) passes. The waiting time (3) is a predetermined period for which processing of minimizing the total sum (W) of the power consumptions of the solid-state light sources 10 and the Peltier elements 20 (Steps 12 to 27) is repeated.

Specifically, even in a state (steady state) where the total sum (W) of the power consumptions is reduced as much as possible, the processing of minimizing the total sum (W) of the power consumptions is repeated every predetermined period.

As shown in FIG. 5, in Step 20, the power controller 154 determines whether or not the total sum (W) of the power consumptions obtained in Step 17 is larger than the total sum ($W_{prev}$) of the power consumptions. If the total sum (W) of the power consumptions is larger than the total sum ($W_{prev}$) of the power consumptions, the power controller 154 moves to a process in Step 21. On the other hand, if the total sum (W) of the power consumptions is equal to or smaller than the total sum ($W_{prev}$) of the power consumptions, the power controller 154 moves to a process in Step 22.

In Step 21, the power controller 154 adds "1" to the number of reversals (M).

In Step 22, the power controller 154 determines whether or not the operating temperature of the solid-state light sources 10 is guaranteed operating temperature. Generally, a temperature range of the solid-state light source guaranteed by a manufacturer of the solid-state light source is determined, regarding circumstance where the solid-state light source is able to emit stable light. Such a temperature range described in a catalog of the solid-state light source, and the like. In the present specification, "the guaranteed operating temperature" refers to the maximum value of the temperature range of the solid-state light source where the manufacturer guarantees the operation (the emission of stable light) of the solid light source. If the operating temperature of the solid-state light sources 10 is the guaranteed operating temperature, the power controller 154 moves to a process in Step 23. On the other hand, if the operating temperature of the solid-state light sources 10 is not the guaranteed operating temperature, the power controller 154 moves to a process in Step 24.

In Step 23, the power controller 154 reverses the polarity of the step width ($\Delta\beta$). Specifically, if the power ($\beta$) supplied to the Peltier elements 20 has been increased, the power controller 154 reduces the power ($\beta$) supplied to the Peltier elements 20 in Step 24 described later. On the other hand, if the power ($\beta$) supplied to the Peltier elements 20 has been reduced, the power controller 154 increases the power ($\beta$) supplied to the Peltier elements 20 in Step 24 described later.

In Step 24, the power controller 154 updates the power consumption ($W_{prev}$). Specifically, the power controller 154 stores the current power consumption (W) as the power consumption ($W_{prev}$).

In Step 25, the power controller 154 increases or reduces the power ($\beta$) supplied to the Peltier elements 20 by the step width ($\Delta\beta$). Note that, in Step 24, as described above, the power controller 154 increases or reduces the power ($\beta$) supplied to the Peltier elements 20 according to the polarity set in Step 23.

Note that, after the process in Step 25 is finished, the power controller 154 moves to the process in Step 14 described above (see FIG. 4).

As shown in FIG. 6, in Step 26, the power controller 154 determines whether or not the detected light amount obtained in Step 15 is larger than the target light amount. If the detected light amount is larger than the target light amount, the power controller 154 moves to a process in Step 27. On the other hand, if the detected light amount is equal to or smaller than the target light amount, the power controller 154 moves to a process in Step 28.

In Step 27, the power controller 154 reduces the power ($\alpha$) supplied to the solid-state light sources 10 by the step width ($\Delta\alpha$).

In Step 28, the power controller 154 increases the power ($\alpha$) supplied to the solid-state light sources 10 by the step width ($\Delta\alpha$).

Note that, after the process in Step 27 or in Step 28 is finished, the power controller 154 moves to the process in Step 15 described above (see FIG. 4).

Moreover, the power controller 154 may move to the process in Step 14 described above. Note that a waiting time required to stabilize the amount of lights emitted from the solid-state light sources 10 is generally shorter than the waiting time required for the operating temperature of the solid-state light sources 10 to become stable, the operating temperature being adjusted by the Peltier elements 20. Therefore, the waiting time when the power controller 154 moves to the process in Step 14 described above may be shorter than the waiting time (2).

(Operations and Effects)

In the illumination apparatus 120 according to the first embodiment, the total sum (W) of the power consumptions of the solid-state light sources 10 and the Peltier elements 20 is taken into consideration for control of the powers supplied to the solid-state light sources 10 and the Peltier elements 20. Therefore, the power consumption can be reduced while keeping constant the amount of lights emitted from the solid-state light sources 10.

In the illumination apparatus 120 according to the first embodiment, even in the steady state where the total sum (W) of the power consumptions is reduced as much as possible, the processing of minimizing the total sum (W) of the power consumptions is repeated every predetermined period (the waiting time (3)). Therefore, even if environmental conditions of the solid-state light sources 10 and the Peltier elements 20 are changed, the total sum (W) of the power consumptions can be maintained at a minimum value.

Example 1

Figure 7:
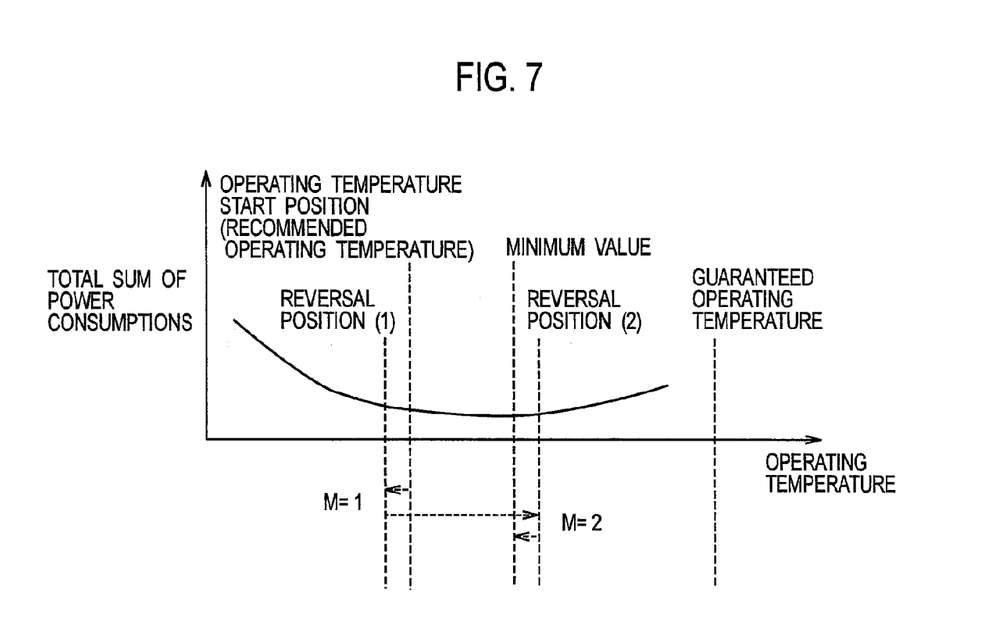
FIG. 7 is a graph for explaining Example 1.

With reference to the drawing, Example 1 will be described below. FIG. 7 is a graph for explaining Example 1. Specifically, in Example 1, description will be given of a method for determining a minimum value of a total sum (W) of power consumptions in the case where, after the total sum (W) of power consumptions is reduced with an increase in an operating temperature, the total sum (W) of power consumptions is increased again. Examples of such a case include the summer when ambient temperatures are high, and the like.

As shown in FIG. 7, at a start position (that is, the recommended operating temperature), an operation of increasing the power ($\beta$) supplied to the Peltier elements 20 by the step width ($\Delta\beta$) is carried on. In this case, since the total sum (W) of power consumptions is increased at a reversal position (1), the polarity of the step width ($\Delta\beta$) is reversed.

Subsequently, an operation of reducing the power ($\beta$) supplied to the Peltier elements 20 by the step width ($\Delta\beta$) is carried on. In this case, since the total sum (W) of power consumptions is increased at a reversal position (2), the polarity of the step width ($\Delta\beta$) is reversed.

Therefore, the total sum (W) of power consumptions is minimized in a state where the power ($\beta$) at the reversal position (2) is increased by the step width (AB).

Example 2

Figure 8:
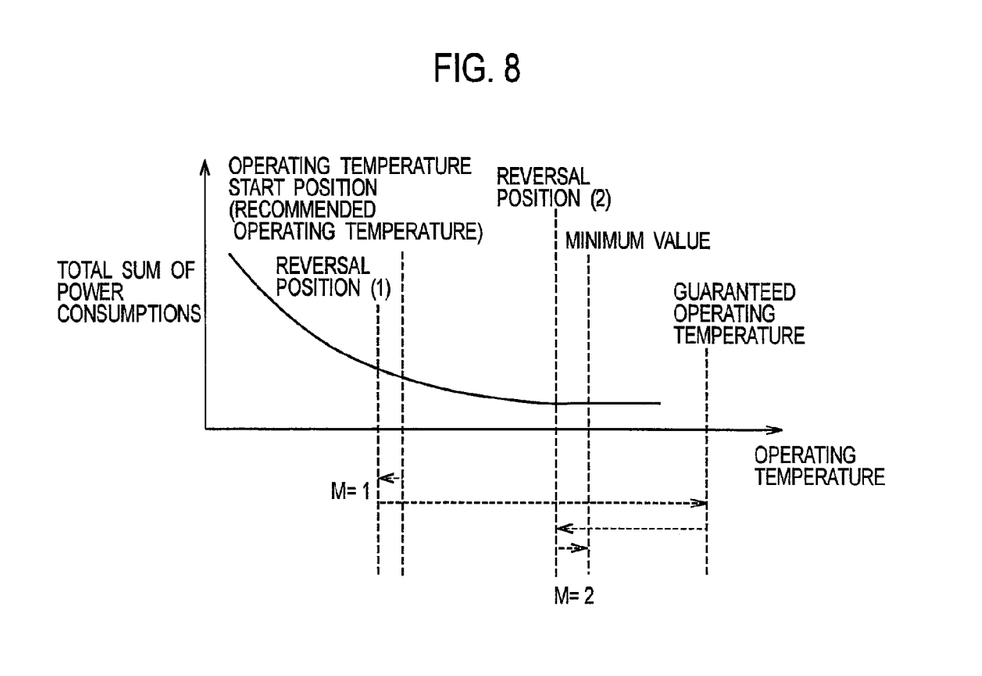
FIG. 8 is a graph for explaining Example 2.

With reference to the drawing, Example 2 will be described below. FIG. 8 is a graph for explaining Example 2. Specifically, in Example 2, description will be given of a method for determining a minimum value of a total sum (W) of power consumptions in the case where, after the total sum (W) of power consumptions is reduced with an increase in an operating temperature, the total sum (W) of power consumptions is not increased again and the operating temperature reaches the guaranteed operating temperature. Examples of such a case include the winter when ambient temperatures are low, and the like.

As shown in FIG. 8, at a start position (that is, the recommended operating temperature), an operation of increasing the power ($\beta$) supplied to the Peltier elements 20 by the step width ($\Delta\beta$) is carried on. In this case, since the total sum (W) of power consumptions is increased at a reversal position (1), the polarity of the step width ($\Delta\beta$) is reversed.

Subsequently, an operation of reducing the power ($\beta$) supplied to the Peltier elements 20 by the step width ($\Delta\beta$) is carried on. In this case, since the total sum (W) of power consumptions is not increased and the operating temperature reaches the guaranteed operating temperature, the polarity of the step width ($\Delta\beta$) is reversed around the guaranteed operating temperature.

Again, the operation of increasing the power ($\beta$) supplied to the Peltier elements 20 by the step width ($\Delta\beta$) is carried on. In this case, since the total sum (W) of power consumptions is increased at a reversal position (2), the polarity of the step width ($\Delta\beta$) is reversed.

Therefore, the total sum (W) of power consumptions is minimized in a state where the power ($\beta$) at the reversal position (2) is reduced by the step width ($\Delta\beta$).

Other Embodiments

The present invention has been described through the embodiment described above. However, it should be understood that the present invention is not limited to the description and drawings which constitute a part of this disclosure. From this disclosure, various alternative embodiments, examples and operational techniques will become apparent to those skilled in the art.

For example, although, in the embodiment described above, the display apparatus is the projection display apparatus 100, the present invention is not limited to the projection display apparatus as long as the apparatus is one that displays images.

In the embodiment described above, the power supplied to the respective solid-state light sources 10 is uniformly controlled. However, the present invention is not limited thereto. Specifically, if the amount of the light emitted from each of the solid-state light sources 10 can be individually detected by the light amount sensor 70, the power supplied to the respective solid-state light sources 10 may be individually controlled.

Similarly, in the embodiment described above, the power supplied to the respective Peltier elements 20 is uniformly controlled. However, the present invention is not limited thereto. Specifically, if the amount of the light emitted from each of the solid-state light sources 10 can be individually detected by the light amount sensor 70, the power supplied to the respective Peltier elements 20 may be individually controlled.

In the embodiment described above, after the powers supplied to the respective Peltier elements 20 is controlled, the power supplied to the respective solid-state light sources 10 is controlled. However, the present invention is not limited thereto. Specifically, the power supplied to the respective Peltier elements 20 may be controlled after the power supplied to the respective solid-state light sources 10 is controlled.

In the embodiment described above, the powers supplied to both of the solid-state light sources 10 and the Peltier elements 20 are controlled. However, the present invention is not limited thereto. Specifically, the power supplied to only one of the solid-state light sources 10 and the Peltier elements 20 may be controlled.

In the embodiment described above, transmission liquid crystal panels (the liquid crystal panels 50) are used as light valves. However, the present invention is not limited thereto. Specifically, the light valves may be a DMD (Digital Micromirror Device) or a LCOS (Liquid Crystal on Silicon).

In the embodiment described above, the Peltier elements 20 have been described as an example of the cooling device. However, the present invention is not limited thereto. Specifically, a liquid cooling device, an air cooling device and the like may be used as the cooling device.

What is claimed is:

1. An illumination apparatus comprising:
   a solid-state light source;
   a cooling device that cools the solid-state light source;
   a light amount sensor that detects an amount of a light emitted from the solid-state light source;
   a monitor that monitors a power consumption of the solid-state light source and a power consumption of the cooling device; and
   a controller that controls a power supplied to the solid-state light source and a power supplied to the cooling device, wherein
   the controller controls any one of the power supplied to the solid-state light source and the power supplied to the cooling device, on the basis of the light amount detected by the light amount sensor and a sum of the power consumptions of the solid-state light source and the cooling device.

2. The illumination apparatus according to claim 1, wherein the controller controls any one of the power supplied to the solid-state light source and the power supplied to the cooling device so as to reduce as much as possible the sum of the power consumptions of the solid-state light source and the cooling device.

3. The illumination apparatus according to claim 1, wherein the controller controls any one of the power supplied to the solid-state light source and the power supplied to the cooling device so as to maintain the light amount detected by the light amount sensor, at a target light amount.

4. The illumination apparatus according to claim 1, wherein the controller repeatedly increases or reduces the power supplied to the cooling device controller repeatedly increases or reduces the power supplied to the cooling device in a cycle of a predetermined period even if the power supplied to the solid-state light source and the power supplied to the cooling device are in a steady state.

5. The illumination apparatus according to claim 1, wherein the controller repeatedly increases or reduces the power supplied to the solid-state light source in a cycle of a predetermined period even if the power supplied to the solid-state light source and the power supplied to the cooling device are in a steady state.

6. The illumination apparatus according to claim 1, wherein the solid-state light source is an array light source having a plurality of light source elements arranged in array.

7. A display apparatus comprising:

a light valve that modulates a light emitted from the solid-state light source; and the illumination apparatus according to claim 1.

8. A projection display apparatus comprising:

a light valve that modulates a light emitted from the solid-state light source;

a projection lens unit that projects the light modulated by the light valve; and the illumination apparatus according to claim 1.

* * * * *